United States Patent
Landru et al.

(10) Patent No.: US 9,911,624 B2
(45) Date of Patent: Mar. 6, 2018

(54) METHOD FOR DISSOLVING A SILICON DIOXIDE LAYER

(71) Applicant: Soitec, Crolles (FR)

(72) Inventors: Didier Landru, Champ Pres Froges (FR); Oleg Kononchuk, Grenoble (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 15/350,290

(22) Filed: Nov. 14, 2016

(65) Prior Publication Data
US 2017/0062236 A1 Mar. 2, 2017

Related U.S. Application Data

(63) Continuation of application No. 14/779,477, filed as application No. PCT/IB2014/000250 on Mar. 3, 2014, now Pat. No. 9,514,960.

(30) Foreign Application Priority Data

Mar. 25, 2013 (FR) ...................................... 13 00706

(51) Int. Cl.
*H01L 21/331* (2006.01)
*H01L 21/322* (2006.01)
(Continued)

(52) U.S. Cl.
CPC ........ *H01L 21/3225* (2013.01); *H01L 21/324* (2013.01); *H01L 21/3226* (2013.01); *H01L 21/7624* (2013.01)

(58) Field of Classification Search
CPC ............... H01L 21/3226; H01L 21/324; H01L 21/7624; H01L 21/322
See application file for complete search history.

(56) References Cited

U.S. PATENT DOCUMENTS

| 6,087,242 A | 7/2000 | Maris et al. |
| 2004/0009678 A1* | 1/2004 | Asai ...................... C23C 16/405 438/785 |

(Continued)

FOREIGN PATENT DOCUMENTS

| CN | 101529578 A | 9/2009 |
| CN | 101573786 A | 11/2009 |

(Continued)

OTHER PUBLICATIONS

Bussmann et al., Thermal Instability of Silicon-on-Insulator Thin Films Measured by Low-Enerty Electron Microscopy, Innovation in Thin Film Processing and Characterizationh, vol. 12, 012016, 2010, 5 pages.

(Continued)

*Primary Examiner* — Charles Garber
*Assistant Examiner* — Abdulfattah Mustapha
(74) *Attorney, Agent, or Firm* — TraskBritt

(57) ABSTRACT

This disclosure relates to a method for dissolving a silicon dioxide layer in a structure, including, from the back surface thereof to the front surface thereof, a supporting substrate, the silicon dioxide layer and a semiconductor layer, the dissolution method being implemented in a furnace in which structures are supported on a support, the dissolution method resulting in the diffusion of oxygen atoms included in the silicon dioxide layer through the semiconductor layer and generating volatile products, and the furnace including traps suitable for reacting with the volatile products, so as to reduce the concentration gradient of the volatile products parallel to the front surface of at least one structure.

18 Claims, 4 Drawing Sheets

(51) Int. Cl.
    *H01L 21/762*    (2006.01)
    *H01L 21/324*    (2006.01)

(56) References Cited

U.S. PATENT DOCUMENTS

2010/0112824 A1    5/2010   Yokokawa et al.
2012/0231636 A1*  9/2012   Landru ............. H01L 21/76243
                                                                        438/795

FOREIGN PATENT DOCUMENTS

FR          2964495 A1    3/2012
WO        2009066135 A1   5/2009

OTHER PUBLICATIONS

International Preliminary Repont on Patentability for International Application No. PCTIIB2014/000250 dated Sep. 29, 2015, 6 pages.
International Search Report for International Application No. PCTIIB2014/000250 dated Jun. 12, 2014, 2 pages.
International Written Opinion for International Application No. PCTIIB2014/000250 dated Jun. 12, 2014, 10 pages.
Kononchuk et al., Internal Dissolution of Buried Oxide in SOI Wafers, Sold State Phenomeda, vols. 131-133, (2008), pp. 113-118.
Kononchuk et al., Novel Trends in SOI Technology for CMOS Applications, Solid State Phenomena, vols. 156-158, (2010) pp. 69-76 (abstract only).
Chinese First Office Action for Chinese Application No. 201480017598.3, dated Mar. 3, 2017, 8 pages.
Chinese First Search for Chinese Application No. 201480017598.3, dated Feb. 23, 2017, 1 page.
French Search Report for French Application No. 1300706, dated Oct. 17, 2013, 2 pages.

* cited by examiner

METHOD FOR DISSOLVING A SILICON DIOXIDE LAYER

CROSS-REFERENCE TO RELATED APPLICATIONS

This application is a continuation of U.S. patent application Ser. No. 14/779,477, filed Sep. 23, 2015, now U.S. Pat. No. 9,514,960, issued Dec, 6, 2016 which is a national phase entry under 35 U.S.C. § 371 of International Patent Application PCT/IB2014/000250, filed Mar. 3, 2014, designating the United States of America and published as International Patent Publication WO 2014/155166 A1 on Oct. 2, 2014, which claims the benefit under Article 8 of the Patent Cooperation Treaty and under 35 U.S.C. § 119(e) to French Patent Application Ser. No. 1300706, filed Mar. 25, 2013, the disclosure of each of which is hereby incorporated herein in its entirety by this reference.

TECHNICAL FIELD

This disclosure relates to a method for dissolving a silicon dioxide layer in a structure of the semiconductor-on-insulator type.

BACKGROUND

A dissolution method known from the prior art, and illustrated in FIGS. 1A and 1B, is a method for dissolving a silicon dioxide layer in a structure 5 of the semiconductor-on-insulator type, comprising, from its rear face 6 to its front face 7, a supporting substrate 8, the silicon dioxide layer 9 and a semiconductor layer 10. The front face 7 corresponds to the free surface of the semiconductor layer 10.

A person skilled in the art will find a technical description of such a method in the articles by Kononchuk (Kononchuk et al., "Novel trends in SOI technology for CMOS applications," *Solid State Phenomena*, Vols. 156-158 (1010) pp. 69-76, and Kononchuck et al., "Internal Dissolution of Buried Oxide in SOI Wafers," *Solid State Phenomena*, Vols. 131-133 (2008) pp. 113-118).

This dissolution method may be implemented in a furnace 1, illustrated in FIG. 2, in which a plurality of structures 5 are held on a support 4 so that the support 4 is suitable for holding the structures 5 with a predetermined distance, typically a few millimeters, between each structure 5, the front face 7 of a structure 5 being opposite the rear face 6 of the structure 5 adjacent to the front face 7.

The structures 5 are subjected to a non-oxidizing atmosphere. The non-oxidizing atmosphere is provided by a continuous flow of inert or reducing gas. The flow of inert gas enters the furnace 1 through an inlet 2, and emerges therefrom through an outlet 3.

The use of such a heat treatment causes the diffusion of oxygen atoms included in the silicon dioxide layer 9 through the semiconductor layer 10. The reaction of the oxygen atoms with the semiconductor layer 10 generates volatile products comprising semiconductor monoxide (ScO). However, the gases present on the surface of the structures 5, in particular, the volatile products generated, have an influence on the dissolution.

Thus, the semiconductor monoxide slows the dissolution reaction when its concentration on the surface of the structures 5 increases.

The composition of the atmosphere of the furnace 1 is not homogeneous. This is because of the small spacing between the structures 5. The volatile products are discharged solely by diffusion at the edge of the structures 5. The result of this is an accumulation of the volatile products that is greater at the center of the surfaces of the structure 5 than at their edge. This means that the dissolution reaction is more rapid at the periphery than at the center of the structures 5.

Moreover, the atmosphere of the furnace 1 is obtained by a constant flow of an inert or reducing gas. The flow of gas entrains, from its entry at inlet 2 into the furnace 1 to its discharge at outlet 3, at least some of the volatile products. Consequently, during its path through the furnace 1, the flow of gas becomes loaded with volatile products.

Depending on their location in the furnace 1, the structures 5 are, therefore, subjected to a variable concentration of volatile products.

Finally, the flow of gas may contain small quantities of oxygen.

Since a complete absence of oxygen in the gas flow would require using very complex means, a small percentage of oxygen in the gas flow entering the furnace 1 is tolerated.

The oxygen included in the atmosphere of the furnace 1 limits the dissolution of the layer of silicon dioxide 9 and degrades the roughness of the free surface of the semiconductor layer 10.

The oxygen contained in the gas flow reacts preferentially with the structures 5 close to the gas inlet 2. The gas flow is, therefore, depleted of oxygen from the inlet 2 of the furnace 1 toward the outlet 3.

This non-homogeneity of the atmosphere of the furnace 1 results in significant variabilities on the characteristics of the structures 5.

The main drawback of this dissolution method is that the non-homogeneity of the atmosphere of the furnace 1 leads to a degradation in the uniformity of thickness of the silicon dioxide layer 9 and of the semiconductor layer 10, as illustrated in FIG. 1B. This is because, at the end of the heat treatment, the thickness of the silicon dioxide layer 9 and the thickness of the semiconductor layer 10 are greater at the center than at the edge of the structure.

Another drawback of this dissolution method is that it is not uniform for all the structures 5 of the semiconductor-on-insulator type contained in the furnace 1. This is because the silicon dioxide layer 9 is not dissolved in the same proportions from one structure 5 to another.

The aforementioned drawbacks are not observed in a furnace 1 containing a single structure 5. However, given the relatively long heat treatment times and for economic reasons, executing such a method in a furnace 1 containing only one structure 5 cannot be envisaged from an industrial point of view.

However, some applications require having recourse to a silicon dioxide layer 9 with a thickness of less than 50 nm so as to be able to apply, for example, an electrical voltage exerted on devices produced in or on the semiconductor layer 10. A very precise control of the thickness of the silicon dioxide layer is then necessary.

Moreover, the structures 5 designated by the term "FDSOI," standing for "fully depleted silicon-on-insulator," are particularly advantageous for producing electronic components such as FDMOS ("fully depleted metal oxide semiconductor") transistors, the channel of which is formed in or on the semiconductor layer 10.

Because of the extreme fineness of the thickness of the semiconductor layer 10 (i.e., around 10 nm), the threshold voltage of the transistor (usually denoted Vt), which depends on this thickness, is very sensitive to the variations in thickness of the semiconductor layer 10.

One aim of the disclosure is, therefore, to propose a method for dissolving a silicon dioxide layer affording precise control of the thicknesses of the semiconductor and silicon dioxide layers.

BRIEF SUMMARY

This disclosure aims to completely or partially remedy the aforementioned drawbacks, and relates to a method for dissolving a silicon dioxide layer in a structure of the semiconductor-on-insulator type, comprising, from its rear face to its front face, a supporting substrate, the silicon dioxide layer and a semiconductor layer, the dissolution method being implemented in a furnace in which a plurality of structures are held on a support, the support being suitable for maintaining a predetermined distance between each structure, the front face of a structure being opposite the rear face of the structure adjacent to the front face, the atmosphere of the furnace being a non-oxidizing atmosphere, the dissolution method causing the diffusion of oxygen atoms included in the silicon dioxide layer through the semiconductor layer and generating volatile products resulting from the reaction of the oxygen atoms with the semiconductor layer, the method being remarkable in that the furnace comprises traps suitable for reacting with the volatile products so as to reduce the concentration gradient of the volatile products parallel to the front face of at least one structure.

In the present text, the vertical direction is defined as being perpendicular to the ground on which the furnace is installed. The terms "upper" and "lower" are defined with respect to this vertical direction.

Concentration gradient of the volatile products parallel to the front face of a structure means the variation in the concentration of the volatile products in the space lying between the front face of the structure and the rear face of the structure adjacent to the front face, and in directions lying in a plane parallel to the front face of the structure.

In contradistinction, a concentration gradient of the volatile products perpendicular to the front face of the structure is defined as being the non-uniformity of the concentration of volatile products in the space lying between the front face of the structure and the rear face of the structure adjacent to the front face, and in a direction perpendicular to the front face of the structure. Thus, the arrangement in the furnace of traps suitable for reacting with the volatile products makes it possible to absorb the products. The result is a reduction in the concentration gradient of the volatile products parallel to the front face of each structure.

Consequently, the dissolution kinetics of the silicon dioxide layer is substantially equal at every point on the structure. Moreover, the absorption of the volatile products makes it possible to have substantially the same concentration of volatile products in the vicinity of the front face of each structure. Thus, the dissolution method is substantially uniform from one structure to another.

According to one embodiment, the traps are disposed on the rear face of the structures of the semiconductor-on-insulator type. Thus, the traps are as close as possible to the front face of each structure. Such proximity of the traps and the front surface of the structures affords better efficacy of the trapping of the volatile products. Moreover, the front face of each structure is exposed uniformly to the layer comprising the traps.

The concentration of volatile products on the surface of each structure is, thus, more uniform and, therefore, the parallel gradient is reduced. Furthermore, the arrangement of the traps in the immediate vicinity of the front face of each structure limits the quantity of volatile products entrained by the gas flow.

Consequently, the kinetics of the dissolution method is substantially equivalent for each of the structures. Thus, since the dissolution reaction is no longer limited by the distance separating the successive structures, it is possible to increase the loading capacity of the furnace in order to execute the dissolution method. Moreover, this embodiment does not require any modification to the furnace.

According to one embodiment, the traps disposed on the rear face are included in a layer with a thickness greater than 30 nm, preferably greater than 50 nm.

According to another embodiment, the traps are included in a coating completely or partially covering the support. Thus, it is not necessary to add manufacturing steps to the structures for executing the dissolution method. Moreover, since the support is brought out of the furnace at each dissolution process, it can easily be coated with a suitable trapping material.

According to one embodiment, the traps are included in trapping layers at least partially covering the front face of substrates referred to as "trap substrates." The trap substrates are disposed on the support, each trap substrate being positioned in place of a structure of a semiconductor type, and inserted between two structures of the semiconductor-on-insulator type, the front face of the trap substrate being opposite the rear face of the structure of the semiconductor-on-insulator type. Thus, it is not necessary to add manufacturing steps to the structures in order to execute the dissolution method.

Moreover, with the trap substrates being brought out of the furnace after each dissolution process, it is possible to form new traps on the support when the latter are saturated with volatile products.

According to one embodiment, the traps are included in a coating wholly or partly covering the internal wall of the furnace. "Inside of the furnace" means the space in which the support holding the structures is introduced during the execution of the dissolution method.

According to one embodiment, the reaction between the volatile products and the traps is a reaction of absorption of the volatile surfaces by the traps. Thus, the absorption of the volatile products by the traps prevents contamination of the furnace, support or structures.

According to one embodiment, the traps comprise silicon dioxide. A thin layer comprising silicon dioxide disposed on the rear face of the structure, and with a thickness greater than 30 nm, or even greater than 50 nm, will withstand a dissolution process at a temperature of between 900° C. and 1300° C. On the other hand, the native oxide naturally present on the rear face of a silicon-on-insulator structure, through its small thickness and its chemical composition, will evaporate during such treatment and cannot fulfill the role of a trap. In this regard, a person skilled in the art will find a technical description of the evaporation of the oxide in a non-oxidizing atmosphere in E. Bussmann et al., "Thermal instability of silicon-on-insulator thin films measured by low-energy electron microscopy," *Innovation in Thin Film Processing and Characterization*, vol. 12, 012016, 2010.

Furthermore, silicon dioxide is compatible with the methods for manufacturing semiconductor structures.

According to one embodiment, the traps comprise at least one of the following materials: tungsten, aluminium nitride, and alumina. Thus, these materials have the advantage of being very stable under temperature.

According to one embodiment, the semiconductor layer comprises silicon.

According to another embodiment, the semiconductor layer has a thickness greater than 100 nm, preferentially greater than 200 nm, even more preferentially greater than 300 nm. Thus, such thicknesses of the semiconductor layer slow down the dissolution reaction. Consequently, the traps have time to react effectively with the volatile products.

According to one embodiment, the layer of silicon dioxide has a thickness of less than 50 nm, preferably less than 25 nm, even more preferentially less than 15 nm.

According to another embodiment, the atmosphere of the furnace comprises at least one species chosen from argon and dihydrogen.

According to one embodiment, the temperature of the furnace is maintained at between 900° C. and 1300° C.

According to another embodiment, traps suitable for reacting with the dioxygen included in the atmosphere of the furnace are disposed in the furnace.

According to one embodiment, the traps intended to react with dioxygen are silicon substrates.

BRIEF DESCRIPTION OF THE DRAWINGS

Other features and advantages will emerge from the following description of embodiments of a dissolution method according to this disclosure, given by way of non-limitative examples with reference to the accompanying drawings, in which.

DETAILED DESCRIPTION

For the various embodiments and for reasons of simplification of the description, the same references will be used for identical elements or ones fulfilling the same function.

Figure 1A:
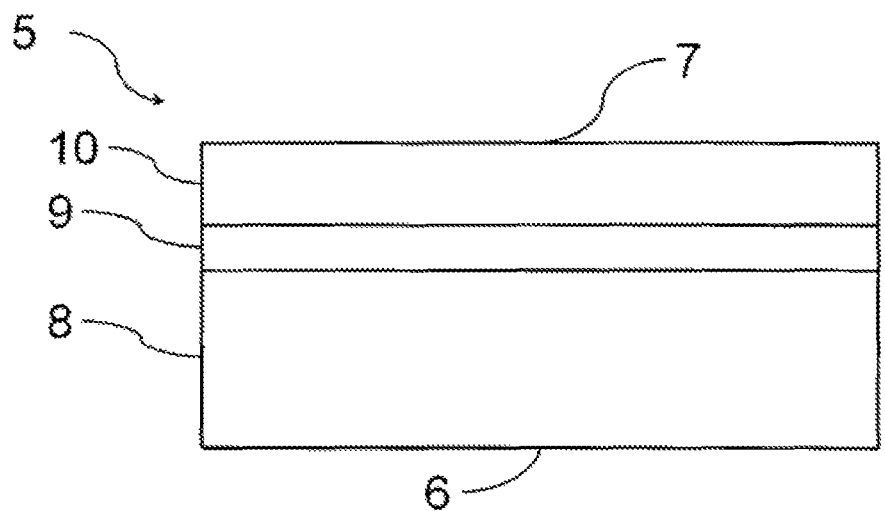
FIGS. 1A and 1B are schematic representations of a structure treated by a method for dissolution of a structure of the semiconductor-on-insulator type according to the techniques known from the prior art.
Figure 1B:
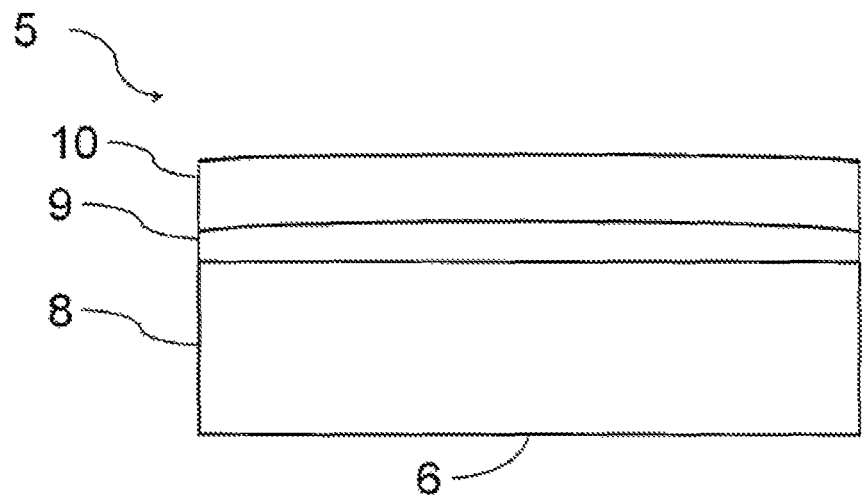
Figure 2:
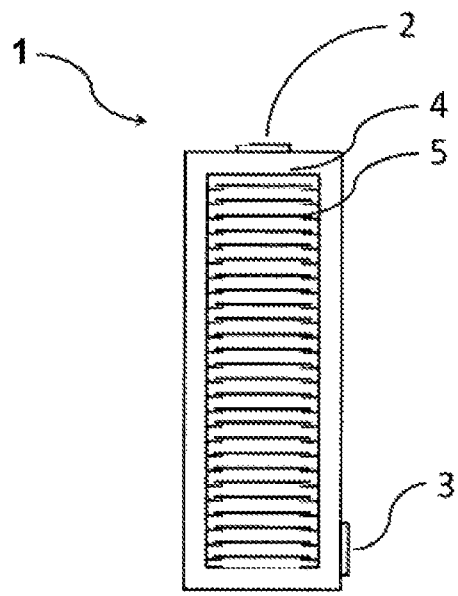
FIG. 2 is a schematic representation of a furnace intended for executing a heat treatment for dissolution of a silicon dioxide layer according to the techniques known from the prior art.
Figure 3A:
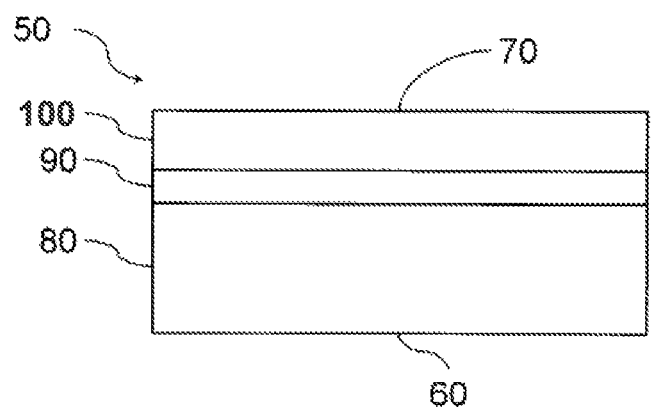
FIGS. 3A and 3B are schematic representations of a structure treated according to the disclosure.
Figure 3B:
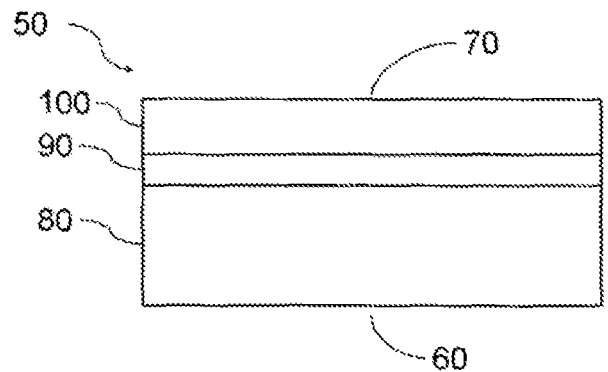

The dissolution method illustrated in FIGS. 3A and 3B is a method for dissolving a silicon dioxide layer 90 in a structure 50 of the semiconductor-on-insulator type.

The structure 50 of the semiconductor-on-insulator type comprises, from its rear face 60 to its front face 70, a supporting substrate 80, the silicon dioxide layer 90 and a semiconductor layer 100.

Figure 4:
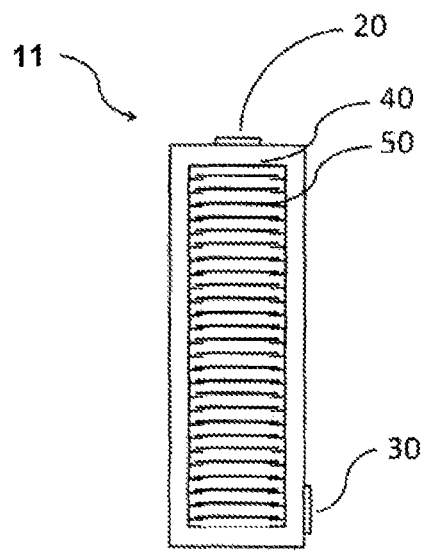
FIG. 4 is a schematic representation of a furnace intended for executing a heat treatment for dissolution of a silicon dioxide layer according to the disclosure.

The dissolution method is implemented in a furnace 11, illustrated in FIG. 4, in which a plurality of structures 50 is held on a support 40, the structures 50 being parallel to one another. The front face 70 of a structure 50 is opposite the rear face 60 of the structure 50 adjacent to the front face 70. The support 40 is suitable for holding the structures 50 with a predetermined distance between each structure 50. The predetermined distance between each structure 50 may be less than 15 nm, preferably less than 10 nm. The atmosphere of the furnace 11 is a non-oxidizing atmosphere.

The dissolution method causes the diffusion of oxygen atoms included in the silicon dioxide layer 90 through the semiconductor layer 100. Volatile products resulting from the reaction of the oxygen atoms with the semiconductor layer 100 are generated. The volatile products comprise semiconductor monoxide (ScO).

Traps 110 (see FIG. 5), suitable for reacting with the volatile products, are disposed in the furnace 11 so as to reduce the concentration gradient of the volatile products parallel to the front face 70 of at least one structure 50. The oxygen content of the non-oxidizing atmosphere is preferably less than 10 ppm (parts per million). The non-oxidizing atmosphere of the furnace 11 is provided by an inert or reducing gas flow. The inert or reducing gas flow can enter the furnace 11 through an inlet 20, and emerges therefrom through an outlet 30.

The atmosphere of the furnace 11 may comprise at least one species chosen from one of the following species: argon and dihydrogen.

During the dissolution process, the temperature of the furnace 11 can be maintained at a temperature between 900° C. and 1300° C., for example 1150° C.

The conditions of implementation of this dissolution method, in particular, its duration, can be adapted in order to partially dissolve the silicon dioxide layer 90.

The supporting substrate 80 may comprise at least one of the following materials: silicon, germanium, alumina, and quartz.

The semiconductor layer 100 may comprise at least one of the following materials: silicon, germanium, and silicon germanium alloy.

Figure 5:
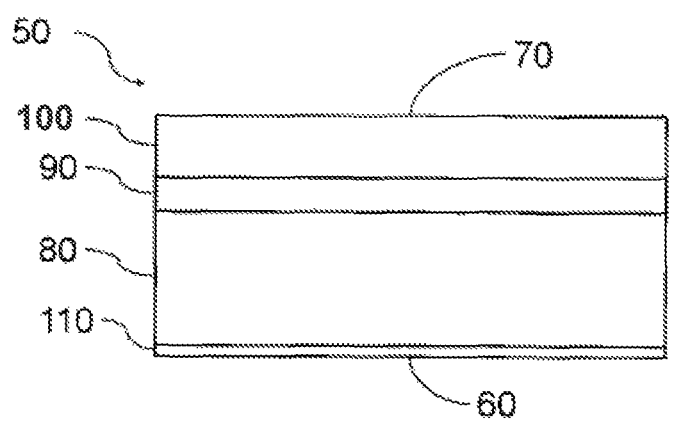
FIG. 5 is a schematic representation of a structure treated according to one embodiment of the disclosure.

According to a particularly advantageous embodiment, and as illustrated in FIG. 5, the traps 110 are disposed on the rear face 60 of the structures 50. Advantageously, a coating comprising the traps 110 may be formed on the rear face 60 of the structures 50. Thus, the traps 110 are as close as possible to the front face 70 of each structure 50. Such proximity of the traps 110 and the front face 70 of the structures 50 affords better efficacy of the trapping of the volatile products. Moreover, the front face 70 of each structure 50 is exposed uniformly to the layer comprising the traps 110. The concentration of the volatile products on the front face 70 of each structure 50 is, thus, more uniform and, therefore, the parallel gradient is reduced. Furthermore, the arrangement of the traps 110 in the immediate vicinity of the front face 70 of each structure 50 limits the quantity of volatile products entrained by the gas flow. Consequently, the variations in concentration of volatile products in the furnace 11 are reduced. Thus, the variabilities in dissolution from one structure 50 to another are reduced. Consequently, the silicon dioxide layer 90 is dissolved substantially in the same proportions from one structure 50 to another.

Figure 6:
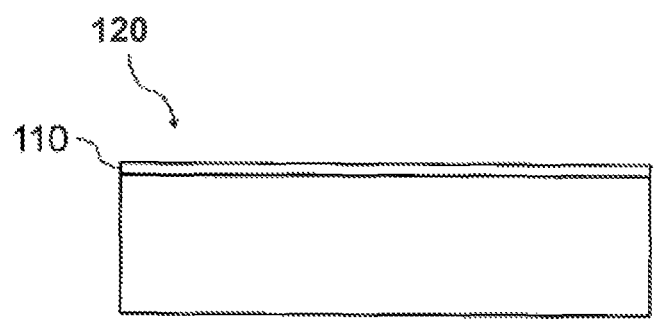
FIG. 6 is a schematic representation of a trap and substrate according to the disclosure.

Alternatively, or in a complementary manner, and as illustrated in FIG. 6, the traps 110 may be included in trapping layers on the front face 70 of the substrates referred to as trap substrates 120. The trap substrates 120 are disposed on the support 40 in place of certain structures 50. Consequently, the variations in concentration of volatile products in the furnace 11 are reduced. Thus, the variabilities of dissolution from one structure 50 to another are reduced.

Particularly advantageously, the traps 110 disposed on the rear face 60 of the structures 50 or on the front face 70 of the trapping layers of the trap substrates 120 may comprise silicon dioxide. On the other hand, the native oxide naturally present on the rear face of a structure of the silicon-oninsulator, through its small thickness and its chemical composition, evaporates during such treatment and cannot fulfill the role of a trap.

The traps 110 comprising silicon dioxide are advantageously formed by thin film deposition techniques. Among film deposition techniques, low-pressure vapor deposition and plasma-activated vapor deposition techniques known to persons skilled in the art will be cited.

Alternatively, the formation of a silicon dioxide film on the rear face 60 of a supporting substrate 80 made from silicon or on the front face of a trap substrate 120 can be advantageously executed by thermal oxidation.

The film formed on the rear face 60 of a structure 50 or on the front face of a trap substrate 120 may have a thickness greater than 30 nm, preferentially greater than 50 nm.

Alternatively, the traps 110 may comprise at least one of the following materials: titanium, tungsten, aluminium nitride, and alumina.

These materials can absorb the semiconductor monoxide formed during the process of dissolution of the silicon dioxide layer 90.

These materials may be formed in the form of films by film deposition techniques known to persons skilled in the art. For example, evaporation techniques are particularly well suited to the formation of films of titanium and tungsten. Aluminium nitride and alumina are advantageously formed by chemical vapor deposition or atomic layer deposition techniques.

Alternatively, or in a complementary fashion, traps 110 may be included in a coating covering all or part of the support 40. Thus, the traps 110 are close to the front face 70 of the structures 50. Consequently, the volatile products are effectively trapped. Particularly advantageously, the traps 110 comprise silicon dioxide. The traps 110 comprising silicon dioxide are advantageously formed by vapor deposition techniques or by thermal oxidation. The coating formed on the support 40 may have a thickness greater than 50 nm, or even greater than 500 nm.

Alternatively, the traps 110 may comprise at least one of the following materials: titanium, tungsten, aluminium nitride, and alumina.

These materials may be formed in the form of a film by film deposition techniques known to persons skilled in the art, for example, chemical vapor deposition or atomic layer deposition techniques.

In a complementary fashion, the traps 110 are included in a coating wholly or partly covering the internal wall of the furnace 11. Particularly advantageously, the traps 110 comprise silicon dioxide.

Alternatively, the traps 110 may comprise at least one of the following materials: titanium, tungsten, aluminium nitride, and alumina.

Particularly advantageously, the semiconductor layer 100 has a thickness greater than 100 nm, preferentially greater than 200 nm, even more preferentially greater than 300 nm. For such thicknesses of semiconductor layer 100, the dissolution speed is less than 0.5 Å/minute.

Thus, the volatile products formed during the dissolution process have the time to diffuse toward the traps 110. Consequently, the variations in concentration of volatile products are reduced. Advantageously, the layer of silicon dioxide 90 has a thickness of less than 50 nm, preferentially less than 25 nm, even more preferentially less than 15 nm.

Advantageously, trap substrates 120 suitable for reacting with the dioxygen included in the atmosphere of the furnace 11 may also be disposed in the furnace 11. The trap substrates 120 intended to react with dioxygen may be silicon substrates disposed on the support 40 in place of certain structures 50. Preferably, the silicon substrates intended to react with the dioxygen included in the atmosphere of the furnace are disposed close to the inert or reducing gas inlet.

Even more preferentially, the silicon substrates are disposed upstream of the inert or reducing gas flow with respect to the structures 50. Thus, the oxygen included in the inert or reducing gas flow reacts with the traps 120 before reaching a structure 50.

The method for dissolving a layer of silicon dioxide 90 according to the disclosure makes it possible to make the composition of the atmosphere of the furnace 11 homogeneous. The accumulation of volatile products is reduced.

Consequently, it is possible to limit the degradation in the uniformity and thickness of the silicon dioxide layer 9 and of the semiconductor layer 10 found in the prior art. Moreover, the method according to the disclosure allows a more uniform dissolution from one structure 50 to another, compared with the method of the prior art.

What is claimed is:

1. A method for dissolving a silicon dioxide layer in a semiconductor-on-insulator type structure, the method comprising:
   providing semiconductor-on-insulator type structures on a support in a furnace, each of the semiconductor-on-insulator type structures comprising a rear face and a front face and including a supporting substrate, a silicon dioxide layer over the supporting substrate, and a semiconductor layer on a side of the silicon dioxide layer opposite the supporting substrate, the support configured for holding the semiconductor-on-insulator type structures with a predetermined distance between the semiconductor-on-insulator type structures, the front face of one of the semiconductor-on-insulator type structures opposite the rear face of another of the semiconductor-on-insulator type structures adjacent to the front face of the one of the semiconductor-on-insulator type structures;
   providing a non-oxidizing atmosphere within the furnace by providing an inert or reducing gas flow entering the furnace through a gas inlet;
   heating the semiconductor-on-insulator type structures within the furnace and causing diffusion of oxygen atoms included in the silicon dioxide layers through the semiconductor layers and resulting in generation of oxygen-based volatile products within the furnace; and
   reacting oxygen included in the inert or reducing gas flow with traps located within the furnace between the gas inlet and a gas outlet of the furnace so as to reduce a concentration of oxygen in the inert or reducing gas flow within the furnace.

2. The method of claim 1, wherein reacting oxygen in the inert or reducing gas flow with traps located within the furnace comprises reacting the oxygen with the traps disposed close to an inert or reducing gas inlet of the furnace.

3. The method of claim 1, wherein reacting oxygen in the inert or reducing gas flow with traps located within the furnace comprises reacting the oxygen with the traps disposed upstream of the inert or reducing gas flow with respect to the semiconductor-on-insulator type structures.

4. The method of claim 1, wherein reacting oxygen in the inert or reducing gas flow with traps located within the furnace comprises reacting the oxygen with trap substrates disposed on the support in place of certain semiconductor-on-insulator structures.

5. The method of claim 1, wherein reacting oxygen in the inert or reducing gas flow with traps located within the furnace comprises reacting the oxygen with traps comprising silicon substrates.

6. The method of claim 1, wherein providing a non-oxidizing atmosphere within the furnace by providing an inert or reducing gas flow comprises providing the inert or reducing gas comprising an oxygen content of less than 10 ppm.

7. The method of claim 1, wherein providing a non-oxidizing atmosphere within the furnace comprises providing at least one of argon and dihydrogen within the furnace.

8. The method of claim 1, wherein heating the semiconductor-on-insulator type structures within the furnace comprises maintaining a temperature of the furnace at a temperature between 900° C. and 1300° C.

9. The method of claim 1, wherein the front faces of the semiconductor-on-insulator type structures comprise a free face of the semiconductor layer.

10. The method of claim 1, wherein reacting oxygen in the inert or reducing gas flow with traps comprises reacting the oxygen with traps comprising titanium, tungsten, aluminium nitride, alumina, or combinations thereof.

11. The method of claim 1, wherein reacting oxygen in the inert or reducing gas flow with traps comprises reacting the oxygen with traps comprising silicon dioxide.

12. A method for dissolving a silicon dioxide layer in a semiconductor-on-insulator type structure, the method comprising:
    providing semiconductor-on-insulator type structures on a support in a furnace, each of the semiconductor-on-insulator type structures comprising a rear face and a front face and including a supporting substrate, a silicon dioxide layer over the supporting substrate, and a semiconductor layer on a side of the silicon dioxide layer opposite the supporting substrate, the front face of one of the semiconductor-on-insulator type structures opposite the rear face of another of the semiconductor-on-insulator type structures adjacent to the front face of the one of the semiconductor-on-insulator type structures;
    flowing a non-oxidizing atmosphere within the furnace;
    heating the semiconductor-on-insulator type structures and causing diffusion of oxygen atoms included in the silicon dioxide layers through the semiconductor layers and resulting in generation of oxygen-based volatile products within the furnace; and
    reacting oxygen of the oxygen-based volatile products in the non-oxidizing atmosphere with traps within the furnace between a gas inlet and a gas outlet of the furnace so as to reduce a concentration of the oxygen-based volatile products within the furnace.

13. The method of claim 12, wherein flowing a non-oxidizing atmosphere within the furnace comprises flowing an inert or reducing gas comprising an oxygen content of less than 10 ppm within the furnace.

14. The method of claim 12, wherein reacting oxygen in the non-oxidizing atmosphere with traps within the furnace comprises reacting the oxygen with traps on the rear faces of the semiconductor-on-insulator type structures.

15. The method of claim 12, wherein reacting oxygen in the non-oxidizing atmosphere with traps within the furnace comprises reacting the oxygen with traps on the support.

16. The method of claim 15, wherein reacting the oxygen with traps on the support comprises reacting the oxygen with a coating on the support.

17. The method of claim 12, wherein reacting oxygen in the non-oxidizing atmosphere with traps within the furnace comprises reacting the oxygen with trapping layers of trap substrates on the support, each trap substrate comprising a front face opposite the rear face of the semiconductor-on-insulator type structures.

18. The method of claim 12, wherein reacting oxygen in the non-oxidizing atmosphere with traps within the furnace comprises reacting the oxygen with traps comprising a thickness of greater than 100 nm.

\* \* \* \* \*